(12) United States Patent
Ganther, Jr. et al.

(10) Patent No.: US 6,356,078 B1
(45) Date of Patent: Mar. 12, 2002

(54) FREQUENCY MULTIPLEXED FLUX LOCKED LOOP ARCHITECTURE PROVIDING AN ARRAY OF DC SQUIDS HAVING BOTH SHARED AND UNSHARED COMPONENTS

(75) Inventors: Kenneth R. Ganther, Jr., Olathe, KS (US); Lowell D. Snapp, Independence, MO (US)

(73) Assignee: Honeywell International Inc., Morris Township, NJ (US)

( * ) Notice: Subject to any disclaimer, the term of this patent is extended or adjusted under 35 U.S.C. 154(b) by 0 days.

(21) Appl. No.: 09/596,137

(22) Filed: Jun. 16, 2000

(51) Int. Cl.$^7$ ............................................. G01R 33/035
(52) U.S. Cl. ....................................... 324/248; 505/846
(58) Field of Search ........................ 324/248; 327/186, 327/527, 528; 505/846, 856; 340/870.12

(56) References Cited

U.S. PATENT DOCUMENTS

| | | | |
|---|---|---|---|
| 4,004,217 A | 1/1977 | Giffard | 324/248 |
| 4,389,612 A | 6/1983 | Simmonds et al. | 324/248 |
| 4,851,776 A | 7/1989 | Goto et al. | 324/248 |
| 5,095,270 A | 3/1992 | Ludeke | 324/248 |
| 5,173,659 A | 12/1992 | Chiba et al. | 324/248 |
| 5,231,353 A | 7/1993 | Nakayama et al. | 324/248 |
| 5,355,085 A | * 10/1994 | Igarashi et al. | 324/248 |
| 5,532,592 A | 7/1996 | Colclough | 324/248 |

OTHER PUBLICATIONS

Clarke, J., SQUID Sensors: Fundamentals, Fabrication and Applications, H. Weinstock ed., Kluwer Academic Press Dordrecht, 1996, pp. 1–62.

Drung, D., Advanced SQUID Read–Out Electronics in SQUID Sensors: Fundamentals, Fabrication and Applications, H. Weinstock, ed., Kluwer Academic Press, Dordrecht, 1996, pp. 63–116.

Kung, P.J., Bracht, R.R., Flynn, E.R., Lewis, P.S., A direct current superconducting quantum interference device gradiometer with a digital signal processor controlled flux–locked loop and comparison with a conventional analog feedback scheme, Rev. Sci. Instrum. 57 (1), Jan. 1996, pp. 222–229.

Kraus Jr., R.H., Bracht, R., Flynn, E.R., Jia, Qu., Maas, P., Reagor, D., and Stettler, M., A digital flux–locked loop for high temperature SQUID magnetometer and gradiometer systems with field cancellation, to be published.

Wellstood, F., Heiden, C., and Clarke, J., Integrated dc SQUID magnetometer with a high slew rate, Rev. Sci. Instrum. 55 (6), Jun. 1984, pp. 952–957.

Matlashov, A., Kraus, Jr., R.H., Espy, M., Ruminer, P., Atencio, L., Garachtchenko, A., Sequential Read–out Architecture for Multi–Channel SQUID Systems, IEEE Transactions on Applied Superconductivity, vol. 9, No. 2, Jun. 1999, pp. 3672–3675.

Ruthroff, C.L., Some Borad–Band Transformers, Proceedings of the IRE, Aug., 1959, pp. 1337–1342.

* cited by examiner

Primary Examiner—Safet Metjahic
Assistant Examiner—Reena Aurora
(74) Attorney, Agent, or Firm—Hovey Williams LLP

(57) ABSTRACT

Architecture for frequency multiplexing multiple flux locked loops in a system comprising an array of DC SQUID sensors. The architecture involves dividing the traditional flux locked loop into multiple unshared components and a single shared component which, in operation, form a complete flux locked loop relative to each DC SQUID sensor. Each unshared flux locked loop component operates on a different flux modulation frequency. The architecture of the present invention allows a reduction from 2N to N+1 in the number of connections between the cryogenic DC SQUID sensors and their associated room temperature flux locked loops. Furthermore, the 1×N architecture of the present invention can be paralleled to form an M×N array architecture without increasing the required number of flux modulation frequencies.

14 Claims, 2 Drawing Sheets

FREQUENCY MULTIPLEXED FLUX LOCKED LOOP ARCHITECTURE PROVIDING AN ARRAY OF DC SQUIDS HAVING BOTH SHARED AND UNSHARED COMPONENTS

RELATED APPLICATIONS

This application is related to a co-pending patent application entitled "Read-Out Electronics for DC SQUID Magnetic Measurements", Ser. No. 09/596,190, filed Jun. 16, 2000, and a co-pending patent application entitled "A Fast Flux Locked Loop", Ser. No. 09/596,135, filed Jun. 16, 2000, both of which are hereby incorporated into the present invention by reference.

FEDERALLY SPONSORED RESEARCH OR DEVELOPMENT

The U.S. government has a paid-up license in this invention and the right in limited circumstances to require the patent owner to license others on reasonable terms as provided for by the terms of contract No. DE-AC04-76-DP00613 awarded by the United States Department of Energy.

BACKGROUND OF THE INVENTION

1. Field of the Invention

The present invention relates to electronic read-out devices, and, more particularly, to an apparatus for providing frequency multiplexing of multiple flux locked loops in systems comprising an array of superconducting quantum interference devices (DC SQUIDs).

2. Description of the Prior Art

DC SQUIDs are small, cryogenically-cooled magnetic sensors that comprise a ring of superconducting material interrupted by two Josephson junctions. DC SQUIDs are designed to detect changes in magnetic flux, and, when suitably biased with a small DC current, will exhibit a magnetic flux sensitivity noise floor of approximately $1 \times 10^{-6} \phi_0 / \sqrt{Hz}$ for low temperature devices that operate at 4 degrees Kelvin (typically cooled by liquid Helium), and approximately $7 \times 10^{-6} \phi_0 / \sqrt{Hz}$ for high temperature devices that operate at 77 degrees Kelvin (typically cooled by liquid Nitrogen). Furthermore, DC SQUIDs exhibit a transfer function that converts magnetic flux into a periodic electrical output signal.

Although a single DC SQUID is sufficient for some applications, there are applications in which it is desirable to employ multiple DC SQUIDs. For example, in non-destructive test and evaluation applications a linear or rectangular array of DC SQUIDs using a sinusoidal excitation functions as a phased array in which the usable DC SQUID measurement directionality can be narrowed and lengthened to improve lateral resolution and increase depth of penetration. While it is possible to simply link multiple single-DC SQUID systems to form such an array, this arrangement is highly undesirable in terms of both redundant componentry and inefficient operation.

One problem arises due to the number of connections between the DC SQUIDs and their associated room temperature read-out electronics. In a typical single-DC SQUID system, there are at least two wire pairs or transmission lines connecting each DC SQUID to its associated room temperature electronics. Thus, for example, in an array formed of ten single-DC SQUID systems, there would be at least twenty of these connections. Such a large number of connections causes high heat transfer to the cryogenics, increases system complexity, and reduces reliability. Attempts at multiplexing DC SQUID arrays used time multiplexing with switches, which involves increased complexity and other problems, such as switching transients.

Another problem involves the amount of redundant componentry—each DC SQUID sensor requires its own complete flux locked loop (FLL) for providing feedback and maintaining a stable operating point.

For these reasons, magnetic measurement systems comprising arrays of DC SQUIDs are complex, costly, and inefficient.

SUMMARY OF THE INVENTION

The frequency multiplexed flux locked loop architecture of the present invention includes essential enabling technology which makes the operation of multi-DC SQUID systems more efficient, economical, and practical. The present invention comprises a system with continuous signals and no time switching devices and therefore none of the associated problems found in the prior art. The present invention makes use of the high bandwidth achieved by the read-out electronics disclosed in the copending patent application entitled "A Fast Flux Locked Loop", Ser. No. 09/596,135, filed Jun. 16, 2000, and the copending patent application entitled "Read-Out Electronics for DC SQUID Magnetic Measurements", Ser. No. 09/596,190, filed Jun. 16, 2000.

Another novel feature of the present invention is that each radio-frequency (RF) flux locked loop (FLL) and its corresponding DC SQUID operate on a different flux modulation frequency ($f_1$ through $f_N$). This allows for a 1×N architecture which reduces from 2N to N+1 the number of required cable connections between the cryogenic DC SQUIDs and their associated room temperature read-out electronics. Thus, for example, a system comprising an array of ten DC SQUIDs, which previously would have required at least twenty cable connections, with their associated heat transfer and added complexity, now requires only eleven connections. Within practical limits, any number of DC SQUIDs can be connected together in a series array using the architecture of the present invention.

While the term 1×N implies linearity, this only applies electrically and does not mean that the physical DC SQUID array must be linear. Furthermore, the 1×N architecture can be paralleled in order to increase array size. The frequencies f1, f2, . . . fN can be repeated in M parallel systems without any interference between the 1×N subsystems. A rectangular array, or an extended linear array, can be easily constructed in this way. For example, a system comprising 150 DC SQUIDs can be arranged as a 15×10 array. This system would be composed of M=15 parallel copies of the 1×N architecture, each with N=10. Frequencies f1, f2, . . . fN would be the same for each parallel system so that only ten frequencies need be used in implementing the entire array. The total number of SQUID connections would be 15×(10+1)=165, which is 135 connections (45%) less than the 15×(2×10)=300 connections required for a non-multiplexed system.

Yet another novel feature of the present invention is that it reduces flux locked loop component redundancy by sharing certain components among the DC SQUIDs, thereby reducing complexity, cost, and size of the apparatus as a whole. Thus, while each DC SQUID still requires some dedicated, frequency-specific flux locked loop componentry, other non-frequency-specific flux locked loop component functions are performed by shared or common components.

These and other important aspects of the present invention are more fully described in the section entitled Detailed Description, below.

BRIEF DESCRIPTION OF THE DRAWINGS

A preferred embodiment of the present invention is described in detail below with reference to the attached drawing figures, wherein.

DETAILED DESCRIPTION OF THE PREFERRED EMBODIMENT

Figure 1:
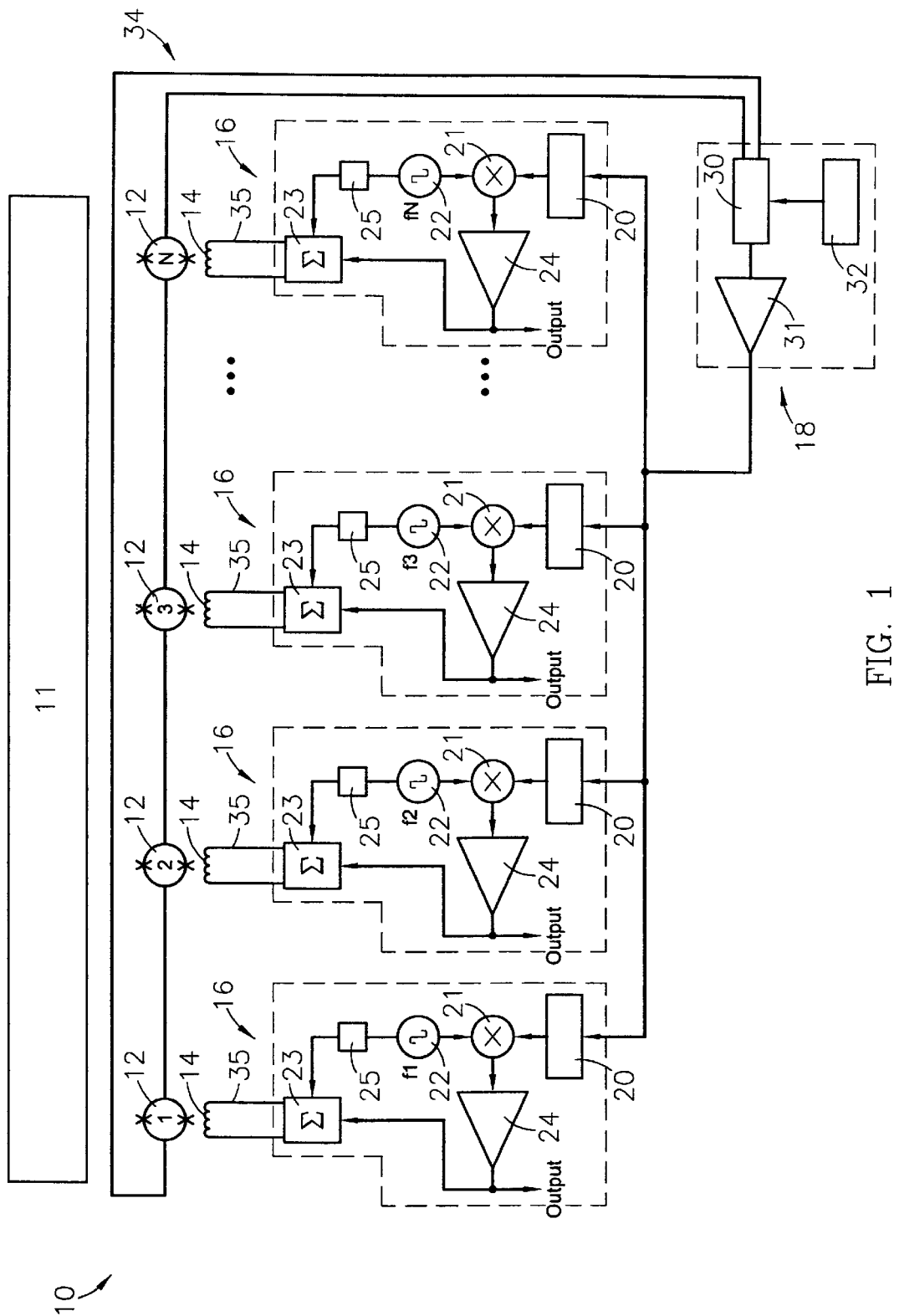
FIG. 1 is a block diagram illustrating a preferred embodiment of the frequency multiplexed flux locked loops of the present invention.

Referring to FIG. 1, a multi-channel DC SQUID system 10 is shown comprising N number of DC SQUID sensors 12; N number of flux modulation coils 14; N number of unshared radio frequency flux locked loop components 16; and a single shared radio-frequency flux locked loop component 18; where N is any integer greater than one. Such a multi-channel DC SQUID system 10 is typically used in the non-destructive testing and evaluation of a unit under test 11 in order to detect, for example, hidden cracks corrosion or other flaws. The DC SQUID sensor 12 and flux modulation coil 14 are well known in the art. The DC SQUID sensors 12, unshared flux lock loop components 16, flux locked loop components 18, and other associated read-out electronics are preferably shielded from undesired radio-frequency signals.

Each unshared flux locked loop component 16 is connected to its associated flux modulation coil 14 by a lower transmission line 35; thus, there are N total lower transmission lines 35. The shared flux locked loop component 18 is connected to the DC SQUID sensors 12 by a single upper transmission line 34.

Each unshared flux locked loop component 16 combines with the single shared flux locked loop component 18 to form a complete radio-frequency flux locked loop relative to each DC SQUID sensor 12. That is, where N=1, the multi-channel DC SQUID system 10 of the present invention is substantially similar, and may be identical, to the DC SQUID sensor, flux modulation coil, and flux locked loop described and shown in the copending patent application entitled "A Fast Flux Locked Loop", Ser. No. 09/596,135, filed Jun. 16, 2000.

1. Unshared Flux Locked Loop Component 16

Each unshared flux locked loop component 16 and its associated DC SQUID sensor 12 operate at a different flux modulation frequency (f1, f2, . . . fN). Thus, the unshared flux locked loop component 16 performs those flux locked loop functions that are frequency specific. The unshared flux locked loop component 16 comprises 5 major components: an RF bandpass filter 20; an RF mixer 21; an RF flux modulation source 22; an RF matching combiner 23; an integrator 24; and a sharpener circuit 25.

The RF bandpass filter 20 is used to separate, from the composite frequency multiplexed signal output by the shared flux locked loop component 18 (described below), the channel and frequency assigned to the particular unshared flux locked loop component 16.

The RF mixer 21 uses direct homodyne conversion at the assigned frequency to extract the desired signal for input into the integrator 24. Thus, the RF mixer 21 feeds the first integrator stage of the integrator 24 with no additional filtering.

The RF flux modulation source 22 produces a square wave flux modulation signal at the particular frequency assigned to the unshared flux locked loop component 16 and its associated DC SQUID sensor 12. Each frequency is located within an assigned frequency channel that is dedicated to a particular DC SQUID sensor 12 (see FIG. 2). The width of each channel should be sufficient to enclose the modulation products of the DC SQUID sensor 12 for the signal of interest, and the spacing of each channel should be sufficient to minimize undesirable interference between channels. The RF flux modulation source 22 can be virtually any fast square wave generator.

The RF matching combiner 23 combines the outputs of the integrator 24 and the sharpener circuit 25, discussed below, in a controlled-impedance RF matching combiner circuit. The output of the RF matching combiner 23 is delivered via the lower transmission line 35 to the flux modulation coil 14.

The integrator 24 performs both integration and differentiation functions. The integrator 24 is comprised of two passive integrator stages, each driving a wideband gain block. This arrangement aids in maximizing the frequency response of the overall integrator 24 since the passive components and wideband active gain blocks can implement the desired tracking bandwidth. The second integrator stage low noise gain block provides the output of the integrator 24. This output signal is attenuated and converted into a controlled source impedance for signal summation in the RF matching combiner 23. Furthermore, because the output of the integrator 24 is an identical image of to the external flux at the particular DC SQUID sensor 12 with which the integrator 24 is associated, the signal characteristics of the external flux can be measured from the output signal of the integrator 24.

Figure 2:
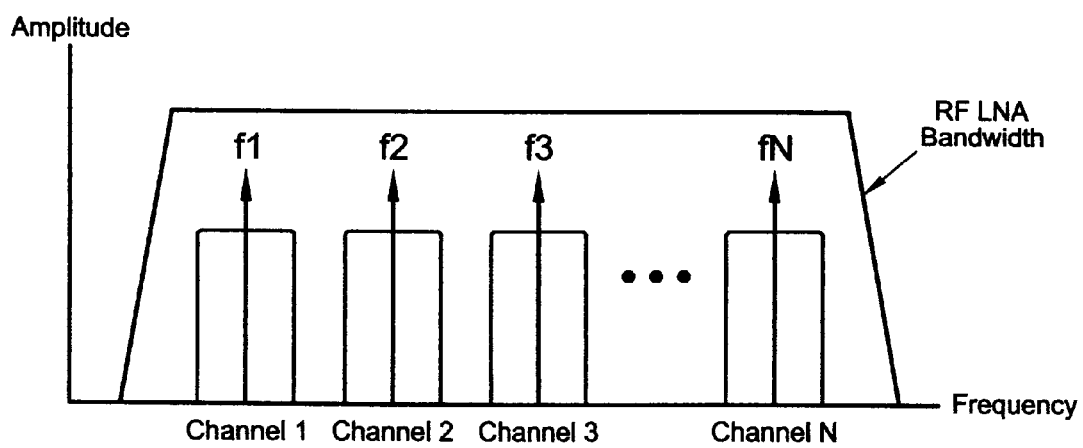
FIG. 2 is a graph illustrating the relationship between amplifier bandwidth and channel width in a preferred embodiment of the present invention.

Referring to FIG. 2, the sharpener circuit 25 serves to produce the sharp edges seen on the channel signals. Thus, inclusion of the sharpener circuit 35 is preferred where the flux modulation frequency is raised to very high RF frequencies. The sharpener circuit 25 is discussed in more detail in the co-pending patent application entitled "A Fast Flux Locked Loop", Ser. No. 09/596,135, filed Jun. 16, 2000.

2. Shared Flux Locked Loop Component 18

The single shared radio-frequency flux locked loop component 18 performs those flux locked loop functions that are frequency non-specific. The shared flux locked loop component 18 comprises three main components: an RF bias tee 30; an RF low noise amplifier 31; and a bias source 32.

The RF bias tee 30 receives the composite frequency multiplexed signal output by the DC SQUID sensors 12, injects DC bias current into the DC SQUID sensors 12, and delivers the DC SQUID sensors' signal to the RF low noise amplifier 31 without disturbing the matching characteristics over the frequency band of interest. The RF bias tee 30 allows the DC bias current to be sent down the same upper transmission line 34 as is used for extracting the output signal from the DC SQUID sensors 12.

The RF low noise amplifier 31 amplifies the signal produced by the DC SQUID sensors 12. A single RF low noise amplifier is preferred, though multiple RF low noise amplifiers operating in parallel may also be used. The bandwidth of the RF low noise amplifier 31 should be sufficient to encompass all of the N individual channels used by the unshared flux locked loop component 16 (see FIG. 2). The design of the present invention is flexible in that any given RF low noise amplifier 31 bandwidth can be channelized with a large number of narrowband channels, a small number of wideband channels, or any combination of the two. One example would be an RF low noise amplifier 31 with a bandwidth of 600MHz encompassing 50 separate 10 MHz channels. The RF low noise amplifier 31 preferably has a gain adjustment circuit for fine tuning control loop dynamics.

The bias source 32 supplies bias current to the RF bias tee 30 for injection into the DC SQUID sensors 12. If the array is monolithic, then the DC SQUID sensors' characteristics are closely matched and all can share the same bias current.

3. Impedance Matching Circuits

The co-pending patent application entitled "A Fast Flux Locked Loop", Ser. No. 09/596,135, filed Jun. 16, 2000, discloses the desirability of impedance matching circuits located at the DC SQUID sensor 12 in the cryogenic environment. If incorporated into the present invention, one impedance matching circuit may be made a part of each unshared flux locked loop component 16, located at the DC SQUID sensor 12, and operable to impedance match the lower transmission line 35 with the unshared flux locked loop component 16. Additionally, an impedance matching circuit may be made a part of the shared flux locked loop component 18, located in the cryogenic environment, and operable to impedance match the upper transmission line 34 with the shared flux locked loop component 18. Because of space limitations, however, it may be preferable to eliminate these impedance matching circuits from the present invention.

In typical RF systems, the transmission lines 34,35 would be impedance matched at both ends, thereby minimizing reflections, standing waves, and signal distortions while simultaneously providing maximum power transfer from the source to the load. If the impedance matching circuits are not included in the present invention, and the upper or lower transmission lines 34,35 are not terminated in the characteristic impedance of the transmission line, signal reflections and standing waves will occur causing distortion in the voltage and current waveforms. It is possible to overcome most of these disadvantages by matching the transmission lines at only one end, the source or the load, whichever is at the higher temperature; the only sacrifice being maximum power transfer.

With regard to the upper transmission line 34, when the DC SQUID end is not matched, the transmission line 34 will appear as a reflective short circuit to the low noise amplifier 31 located at the opposite end of the transmission line 34. The low noise amplifier 31, in turn, appears as, a line termination resistor to the DC SQUID 12. With regard to noise, however, the low noise amplifier 31 will appear as a Johnson noise source. The broadband Johnson noise source signals propagate down the transmission line 34, from the low noise amplifier end, are reflected back by the DC SQUID 12, propagate back to the low noise amplifier 31, and sum with the incident Johnson noise source. The reflected signals will add or subtract with the incident signals at different frequencies, depending upon the length of the transmission line 34. The frequency spectrum of noise at the output of the low noise amplifier 31 exhibits broad peaks and nulls. If the flux locked loop is operated in one of the nulls, the effective noise figure of the low noise amplifier 31 is reduced and the system noise performance approaches that of a cold transformer matched system. The shorter the transmission line 34, the wider the null bandwidth becomes.

Very short, near zero cable length can occur with cryopump and other applications where the non-cryogenic electronics can be very close to the DC SQUID 12. Short cables also reduce the loop delay, allow higher flux modulation frequencies and correspondingly wider tracking bandwidths.

Selecting the flux modulation frequency to operate in one of the nulls will reduce the effective noise figure of the low noise amplifier 31 but will have no effect on noise signals coming from the DC SQUID 12. These noise signals will be amplified by the low noise amplifier 31 and summed with the nulled amplifier noise.

With regard to the lower transmission line 35, when the modulation coil 14 is not matched, the transmission line 35 will appear to the matching combiner 23 as a reflective short circuit. The resulting impedance mismatch creates a voltage reflection from the load that is reflected back up the line 35 and is absorbed in the matching source impedance of the matching combiner 23 and is not re-reflected. Even though standing waves occur and the voltage waveform at the matching combiner 23 may be distorted, the signal current waveform delivered to the modulation coil 14 is not distorted and the waveform fidelity is preserved regardless of signal frequency or line length. Even without a transmission line match, current flows through the coil to create the desired magnetic field at the DC SQUID sensor 12 and full operational bandwidth is preserved.

With both the upper and lower transmission lines 34,35, if the lines are coaxial cable, which is preferred, then full system shielding effectiveness is maintained.

4. Operation

The arrayed DC SQUID sensors 12 detect the magnetic response of the unit undertest 11 to an externally applied magnetic stimulus. Each DC SQUID sensor 12 converts the detected magnetic response to an electrical signal which is then transmitted via the upper transmission line 34 to the RF bias tee 30 of the shared flux locked loop component 18. The RF bias tee 30 serves to both inject into the DC SQUID sensors 12 bias current produced by the bias source 32 and output to the RF low noise amplifier 31 the composite frequency multiplexed signal received from the DC SQUID sensors 12. The RF low noise amplifier 31 amplifies the signal and outputs it to each unshared flux locked loop component 16. Thus, the shared flux locked loop component 18 combines with each unshared flux locked loop component 16 to form a single complete radio-frequency flux locked loop relative to each DC SQUID sensor 12.

For each unshared flux lock loop component 16, being assigned to a particular channel, an RF bandpass filter 20 separates the particular channel from the composite multiplexed signal output by the RF low noise amplifier 31. The RF bandpass filter 20 feeds an RF mixer 21 which uses direct homodyne conversion at the assigned frequency to extract the signal for input into the integrator 24. Each integrator 24 generates the feedback and output signals of the unshared flux locked loop component 16. The feedback signal is combined in the RF matching combiner 23 with the flux modulation signal produced by the flux modulation source 22. The signal output by the RF matching combiner 23 is transmitted via the lower transmission line 35 to the modulation coil 14 which converts the electrical current feedback into magnetic feedback for the DC SQUID sensors 12 in order to maintain linear operation and a stable operating point. This process occurs simultaneously in all of the DC SQUID sensors 12 and unshared flux locked loop components 16 of the array.

From the preceding description, it can be seen that the frequency multiplexed flux locked loop architecture of the present invention allows for more efficient and economical use of multi-DC SQUID sensor arrays in magnetic measurement systems. One advantage of the present invention is that it reduces from 2N to N+1 the number of connections between the cryogenic DC SQUID sensors and their associated room temperature flux locked loops. Another advantage of the present invention is that it reduces the number of flux locked loop components exclusively dedicated to a particular DC SQUID sensor by making certain flux locked loop components common to all of the DC SQUID sensors.

Although the invention has been described with reference to the preferred embodiment illustrated in the attached drawings, it is noted that equivalents may be employed and substitutions made herein without departing from the scope of the invention as recited in the claims. Furthermore, the copending patent application entitled "A Fast Flux Locked Loop", Ser. No. 09/596,135, filed Jun. 16, 2000, and the copending patent application entitled "Read-Out Electronics for DC SQUID Magnetic Measurements", Ser. No. 09/596,190, filed Jun. 16, 2000, are both incorporated herein by reference along with any refinements to the flux locked loop architecture of the present invention which are suggested by the copending patent applications. Thus, it is contemplated that the phase setting circuit, amplitude setting circuit, and buffer amplifier disclosed in the copending patent application entitled "Read-Out Electronics for DC SQUID Magnetic Measurements", Ser. No. 09/596,190, filed Jun. 16, 2000, may be incorporated individually or en masse into the unshared flux locked loop component of the present invention.

Similarly, the low Johnson noise impedance matching circuit and DC/RF matching circuit disclosed in the copending patent application entitled "A Fast Flux Locked Loop", Ser. No. 09/596,135, filed Jun. 16, 2000, may be incorporated individually or together into the present invention. The preferability of doing so is application dependent.

Having thus described the preferred embodiment of the invention, what is claimed as new and desired to be protected by Letters Patent includes the following:

1. Frequency multiplexed flux locked loop architecture operable to provide feedback to and receive input signals from at least two direct current superconducting quantum interference devices, the direct current superconducting quantum interference devices being located within a cryogenic environment, the frequency multiplexed flux locked loop architecture comprising:

at least two radio-frequency unshared flux locked loop components, with the number of unshared radio-frequency flux locked loop components being equal to the number of direct current superconducting quantum interference devices, and each unshared radio-frequency flux locked loop component having a signal frequency and frequency channel that is different from the signal frequency and frequency channel of the other unshared radio-frequency flux locked loop component;

a single shared radio-frequency flux locked loop component operable to receive as a composite signal the input signals produced by the direct current superconducting devices, the single shared radio-frequency flux locked loop component being combinable with each unshared radio-frequency flux locked loop component to form a complete radio-frequency flux locked loop relative to each direct current superconducting quantum interference device.

2. The frequency multiplexed flux locked loop architecture of claim 1, further comprising at least one upper transmission line electrically connecting the direct current superconducting quantum interference devices to the shared radio-frequency flux locked loop component.

3. The frequency multiplexed flux locked loop architecture of claim 1, further comprising at least two lower transmission lines, with each lower transmission line electrically connecting each unshared radio-frequency flux locked loop component to an associated modulation coil, the number of lower transmission lines being equal to the number of unshared radio-frequency flux locked loop components.

4. The frequency multiplexed flux locked loop architecture of claim 1, further comprising at least one impedance matching circuit located in the cryogenic environment and operable to match the characteristic impedance of the lower transmission line to the characteristic impedance of the direct current superconducting quantum interference device.

5. The frequency multiplexed flux locked loop architecture of claim 1, further comprising at least one impedance matching circuit located in the cryogenic environment and operable to match the characteristic impedance of the upper transmission line to the characteristic impedance of the direct current superconducting quantum interference device.

6. The frequency multiplexed flux locked loop architecture of claim 1, each unshared radio-frequency flux locked loop component comprising:

a radio-frequency bandpass filter operable to receive the composite signal from the shared radio-frequency flux locked loop component and to pass a particular signal component of the composite signal, with the signal component having a particular signal frequency and a particular frequency channel;

a radio-frequency mixer operable to provide synchronous demodulation of the particular signal component;

a radio-frequency flux modulation source operable to produce a flux modulation signal having a flux modulation frequency;

an integrator operable to perform integration on the particular signal component;

a radio-frequency matching combiner operable to combine the flux modulation signal and the particular signal component.

7. The frequency multiplexed flux locked loop architecture of claim 6, the radio-frequency matching combiner being further operable to impedance match a transmission line coupled therewith.

8. The frequency multiplexed flux locked loop architecture of claim 6, each unshared radio-frequency flux locked loop component further comprising a phase setting circuit operable to adjust the phase of the flux modulation signal.

9. The frequency multiplexed flux locked loop architecture of claim 6, each unshared radio-frequency flux locked loop component further comprising an amplitude setting circuit operable to preserve the waveform of the flux modulation signal while obtaining a desired amplitude for the flux modulation signal.

10. The frequency multiplexed flux locked loop architecture of claim 6, each unshared radio-frequency flux locked loop component further comprising a buffer amplifier operable to amplify the signal output by the integrator.

11. The frequency multiplexed flux locked loop architecture of claim 6, each unshared radio-frequency flux locked loop component further comprising a sharpener circuit operable to obtain fast rise and fall times on the flux modulation signal produced by the flux modulation source.

12. The frequency multiplexed flux locked loop architecture of claim 1, the shared radio-frequency flux locked loop component comprising:

a radio-frequency bias tee operable to inject bias current into the direct superconducting quantum interference devices and to receive the composite signal;

at least one bias source operable to produce a biasing current for injection by the radio-frequency bias tee into the direct superconducting quantum interference devices; and a radio-frequency amplifier being operable to amplify a signal and having a bandwidth sufficient to encompass all of the particular signal frequencies and particular frequency channels used by the unshared radio-frequency flux locked loop components.

13. The frequency multiplexed flux locked loop architecture of claim 12, the radio-frequency amplifier being further operable to impedance match a transmission line coupled therewith.

14. Frequency multiplexed flux locked loop architecture operable to provide feedback to and receive input signals from at least two sensors, the frequency multiplexed flux locked loop architecture comprising:

at least two unshared flux locked loop components, with the number of unshared flux locked loop components being equal to the number of sensors, and each unshared flux locked loop component having a signal frequency and frequency channel that is different from the signal frequency and frequency channel of the other unshared flux locked loop component;

a single shared flux locked loop component operable to receive as a composite signal the input signals produced by the sensors, the single shared flux locked loop component being combinable with each unshared flux locked loop component to form a complete flux locked loop relative to each sensor.

* * * * *